(12) United States Patent
Tamura et al.

(10) Patent No.: US 9,385,283 B2
(45) Date of Patent: Jul. 5, 2016

(54) LIGHT EMITTING DEVICE EQUIPPED WITH PROTECTIVE MEMBER

(71) Applicant: NICHIA CORPORATION, Anan-shi, Tokushima (JP)

(72) Inventors: Takeshi Tamura, Anan (JP); Tomonori Ozaki, Anan (JP); Yasuo Fujikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 24 days.

(21) Appl. No.: 14/036,505

(22) Filed: Sep. 25, 2013

(65) Prior Publication Data
US 2014/0091333 A1    Apr. 3, 2014

(30) Foreign Application Priority Data
Sep. 28, 2012   (JP) ................. 2012-216944

(51) Int. Cl.
*H01L 33/52*   (2010.01)
*H01L 25/16*   (2006.01)

(52) U.S. Cl.
CPC .............. *H01L 33/52* (2013.01); *H01L 25/167* (2013.01); *H01L 2924/0002* (2013.01)

(58) Field of Classification Search
CPC ......... H01L 33/52; H01L 33/00; H01L 33/50; H01L 33/48; H01L 33/44; H01L 33/62

USPC ........ 257/88, 99, 79, 81, 82, 83, 98, 431, 451
See application file for complete search history.

(56) References Cited

U.S. PATENT DOCUMENTS

| | | | |
|---|---|---|---|
| 6,225,688 B1* | 5/2001 | Kim et al. ...................... | 257/686 |
| 6,603,148 B1* | 8/2003 | Sano et al. ...................... | 257/98 |
| 2009/0146171 A1* | 6/2009 | Okubo ............................ | 257/98 |
| 2012/0049203 A1* | 3/2012 | Mondada et al. ............... | 257/88 |
| 2012/0126267 A1* | 5/2012 | Jung et al. ...................... | 257/98 |
| 2013/0248894 A1* | 9/2013 | Nakamura et al. .... | H01L 33/486 257/88 |

FOREIGN PATENT DOCUMENTS

| | | |
|---|---|---|
| JP | 02-90265 U | 7/1990 |
| JP | 2006-269778 A | 10/2006 |
| JP | 2011-228602 A | 11/2011 |
| JP | 2012-164742 A | 8/2012 |

* cited by examiner

*Primary Examiner* — Chuong A Luu
(74) *Attorney, Agent, or Firm* — Global IP Counselors, LLP

(57) ABSTRACT

A light emitting device includes a light emitting device body and a protective member. The light emitting device body has a flexible base member, at least one light emitting element arranged on the base member, and a sealing resin member sealing the light emitting element. The protective member is disposed adjacent to the sealing resin member on the base member. The protective member has a height greater than a height of the sealing resin member.

15 Claims, 10 Drawing Sheets

US 9,385,283 B2

LIGHT EMITTING DEVICE EQUIPPED WITH PROTECTIVE MEMBER

CROSS-REFERENCE TO RELATED APPLICATIONS

This application claims priority to Japanese Patent Application No. 2012-216944 filed on Sep. 28, 2012. The entire disclosure of Japanese Application No. 2012-216944 is hereby incorporated herein by reference.

BACKGROUND OF THE INVENTION

1. Field of the Invention

The present invention relates to a light emitting device which includes a light emitting device and a protective member.

2. Discussion of the Related Art

There has been known a light emitting device which includes light emitting elements arranged on a flexible substrate, and a sealing member which seals the light emitting elements (see, for example, Patent Literature 1: JP2011-228602 A). In Patent Literature 1: JP2011-228602A, roll-to-roll processing is employed, in which, while pulling out a roll of a flexible substrate, light emitting elements and sealing resins are arranged on the flexible substrate, and then re-reeling the flexible substrate after arranging them.

SUMMARY OF THE INVENTION

A light emitting device according to an aspect of the present invention includes a light emitting device body and a protective member. The light emitting device body has a flexible base member, at least one light emitting element arranged on the base member, and a sealing resin member sealing the light emitting element. The protective member is disposed adjacent to the sealing resin member on the base member. The protective member has a height greater than a height of the sealing resin member.

According to the present invention, there is provided a light emitting device equipped with a protective member which can prevent damage to the sealing resin member.

DETAILED DESCRIPTION OF EMBODIMENTS

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, it is needless to say that the drawings may also include the components that have different dimensional relations and ratios among one another.

Overall Structure of Light Emitting Device 1 Equipped With Protective Member

Figure 1:
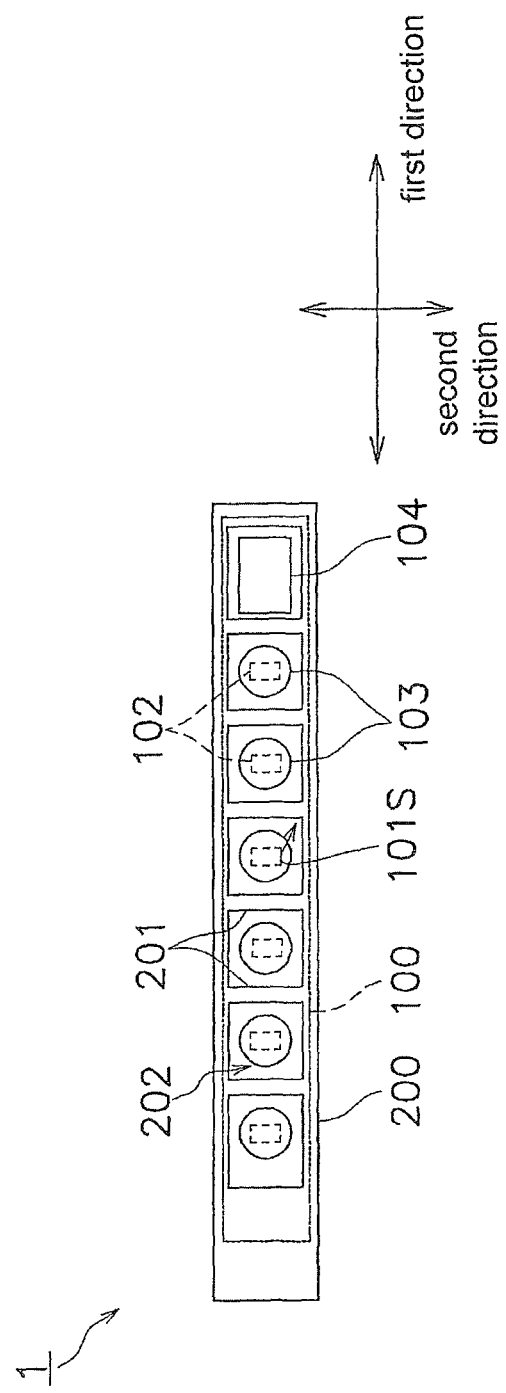
FIG. 1 is a top view showing an overall structure of a light emitting device equipped with a protective member.
Figure 2:
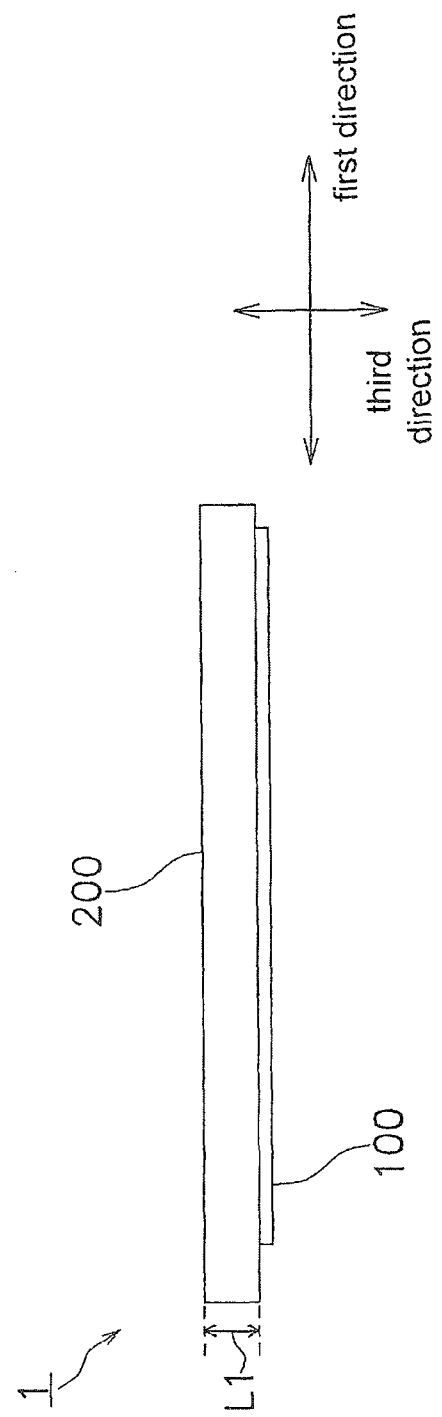
FIG. 2 is a side view showing an overall structure of a light emitting device equipped with a protective member.

FIG. 1 is a top view showing an overall structure of a light emitting device assembly in which a light emitting device 1 is equipped with a protective member. FIG. 2 is a side view showing an overall structure of the light emitting device assembly in which the light emitting device 1 is equipped with the protective member.

The light emitting device 1 equipped with a protective member is an elongated member in one direction. At the time of packaging and shipping, a plurality of the light emitting devices 1 equipped with a protective member may be encased together, or a plurality of the light emitting devices 1 equipped with a protective member may be connected and rolled up onto a spool. At the time of rolling up, the sealing resin member side can be on the inner side or outer side. In the description below, the terms "first direction" refers to the longitudinal direction of the light emitting device 1 equipped with a protective member, "second direction" refers to the lateral direction which is perpendicular to the first direction in a top view, and "third direction" refers to a thickness direction which is perpendicular to the first direction and the second direction.

The light emitting device 1 equipped with a protective member includes a light emitting device body 100 and a protective member 200.

1. Light Emitting Device Body 100

The light emitting device body 100 is an elongated member in the first direction. The light emitting device body 100 includes a base member 101, a plurality of light emitting elements 102, a plurality of sealing resin members 103, and a connector 104 (an example of electronic components). The structure of the light emitting device body 100 will be described later.

2. Protective Member 200

The protective member 200 is an elongated member in the first direction. The protective member 200 is arranged on the base member 101 of the light emitting device body 100. The protective member 200 is attached to the base member 101 with low adhesion. Accordingly, the protective member 200 can be attached and removed at will with respect to the base member 101.

The protective member 200 includes a plurality of dividers 201 and a plurality of housing holes 202. The plurality of dividers 201 divide a large opening formed in the protective member 200 at approximately uniform intervals. The plurality of housing holes 202 are spaces respectively formed between the plurality of dividers 201. In the plurality of housing holes 202, the plurality of sealing resin members 103 and the connector 104 are housed respectively. As described above, the protective member 200 is disposed adjacent to the plurality of sealing resin members 103 and the connector 104. In the third direction, the height L1 of the protective member 200 is greater than the height L2 (see FIG. 4) of the sealing resin members 103 to be described later. With this arrangement, at the time of packaging and shipping the light emitting device 1 equipped with a protective member, the plurality of the sealing resin members 103 and the connector 104 can be prevented from rubbing with other members. Also, in the case where the light emitting device body 100 is used as being attached to a heat sink or the like, the protective member 200 can be pushed against the heat sink, so that the plurality of sealing resin members 103 and the connector 104 can be prevented from receiving an excessive pressure.

In the present embodiment, the expression "protective member 200 is disposed adjacent to a sealing resin member 103" includes not only a case where the protective member 200 is spaced apart from a sealing resin member 103 at a certain distance (for example, about 1 cm) as shown in FIG. 1, but also a case where the protective member 200 is in contact with a sealing resin member 103. In the similar manner, the expression "protective member 200 is disposed adjacent to the connector 104" includes not only a case where the protective member 200 is spaced apart from the connector 104 at a certain distance (for example, about 1 cm) as shown in FIG. 1, but also a case where the protective member 200 is in contact with the connector 104. Also, as shown in FIG. 1, the plurality of sealing resin members 103 and the connector 104 are exposed from the protective member 200 in the plurality of housing holes 202 respectively.

The thickness of the protective member 200 is, as shown in FIG. 2, preferably greater than the heights of the plurality of the sealing resin members 103 and/or the connector 104. The protective member 200 can be formed with an insulating resin (for example, a polystyrene or a cellulose), a cornstarch, or the like, and is also preferably formed with a porous material with elasticity or flexibility such as urethane material or paper material.

The size of the protective member 200 can be appropriately adjusted according to the size of the light emitting device body 100. In the present embodiment, the protective member 200 is larger then the light emitting device body 100 and arranged to cover the whole surface of the first main surface 101S of the base member 101, but the arrangement is not limited to this. The protective member 200 may be smaller than the light emitting device body 100, and covers a part of the first main surface 101S of the base member 101.

Structure of Light Emitting Device Body 100

Next, the structure of the light emitting device body 100 will be described with reference to the drawings.

1. General Structure of Light Emitting Device Body 100

Figure 3:
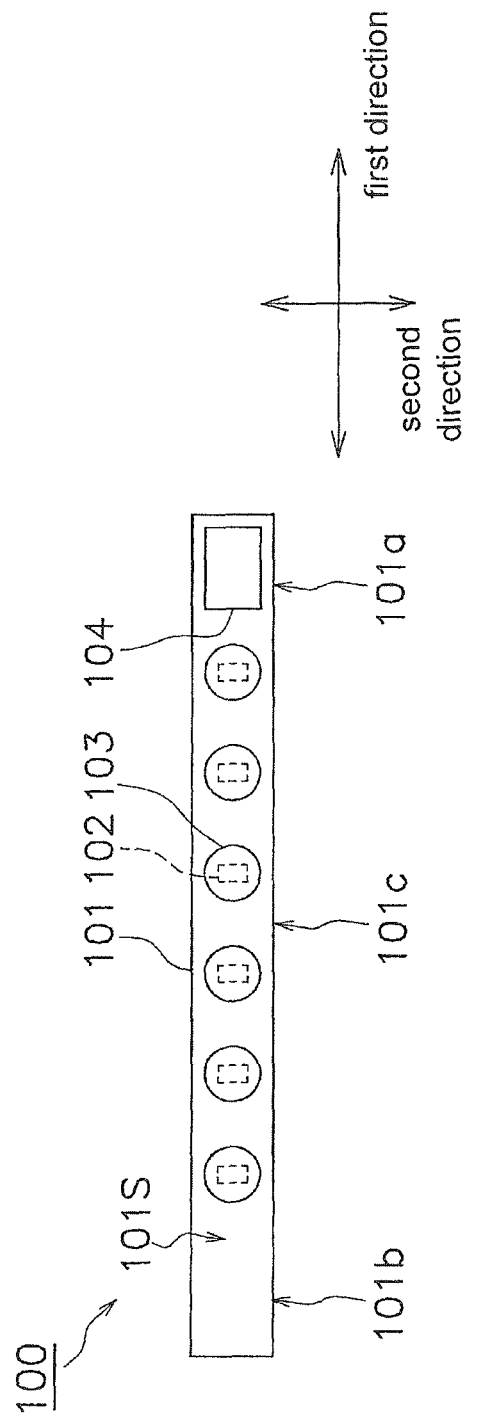
FIG. 3 is a top view showing a schematic structure of a light emitting device.
Figure 4:
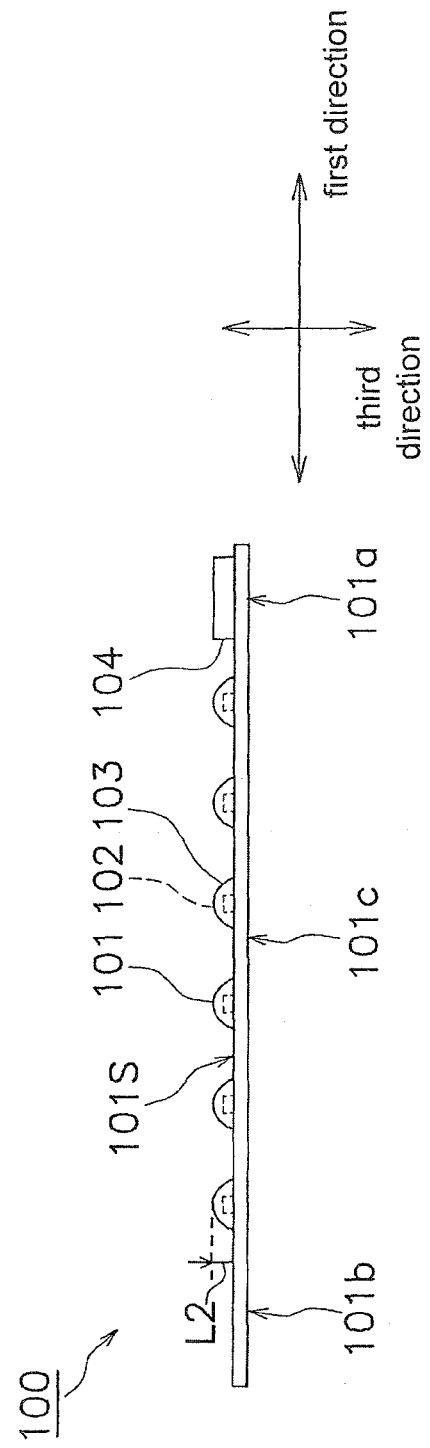
FIG. 4 is a side view showing a schematic structure of a light emitting device.

Firstly, a general structure of the light emitting device body 100 will be described with reference to the drawings. FIG. 3 is a top view showing a general structure of a light emitting device body 100. FIG. 4 is a side view showing a general structure of a light emitting device body 100.

The light emitting device body 100 includes a base member 101, a plurality of light emitting elements 102, a plurality of sealing resin members 103, and a connector 104.

The light emitting device 101 is an elongated member extending in the first direction. The base member 101 includes a first end portion 101a, a second end portion 101b, and an intermediate portion 101c. On the first end portion 101a, a connector 104 is arranged. On the intermediate portion 101c, a plurality of light emitting elements 102 and a plurality of sealing resin members 103 are arranged.

The ratio of the size of the base member 101 in the first direction to that in the second direction can be set appropriately, and for example, a ratio of 6:1, 30:1, or 100:1 can be employed. More specifically, the length of the base member 101 in the first direction can be, for example, 1150 mm, and the width of the base member 101 in the second direction can be, for example 15 mm. Also, the thickness of the base member 101 in the third direction can be, for example, 20 μm to 800 μm. The structure of the base member 101 will be described later.

The plurality of light emitting elements 102 are arranged on a main surface 101S of the base member 101. More specifically, the plurality of light emitting elements 102 are arranged in a line along the first direction on the intermediate portion 101c of the base member 101. Also, each of the plurality of the light emitting elements 102 is electrically connected to the connector 104 via the base member 101. The plurality of light emitting elements 102 emit light when supplied with electrical current from an external power source which is connected to the connector 104. The structure of the light emitting elements 102 will be described later.

The plurality of sealing resin members 103 are arranged on a main surface 101S of the base member 101. The plurality of the sealing resin members 103 seal the plurality of the light emitting elements 102 respectively. Therefore, the plurality of the sealing resin members 103 are arranged in a line along the first direction on the intermediate portion 101c of the base member 101. In the present embodiment, the plurality of sealing resin members 103 are formed in a hemisphere shape centered at respective light emitting elements 102. For the technique of sealing, for example, potting, transfer molding, screen printing, etc., can be used, but is not limited to those techniques. In the third direction, the height L2 of a sealing resin member 103 is smaller than the height L1 of the protective member 200. Accordingly, in a side view, the sealing resin members 103 are concealed in the protective member 200.

The plurality of the sealing resin members 103 are formed with a light transmissive resin (for example, an epoxy resin, a urea resin, a silicone resin, etc). It is preferable that the A-hardness of the sealing resin members 103 is 30 or greater and the D-hardness of the sealing resin members 103 is 50 or less. With this arrangement, the sealing resin member 103 can be prevented from deformed by an external force, which in turn can prevent effect on the optical properties due to deformation of the sealing resin members 103. The sealing resin members 103 may contain a light diffusing agent (barium sulfate, titanium oxide, aluminum oxide, silicon oxide, etc). Also, the plurality of sealing resin members 103 preferably contains a wavelength converting member such as a fluorescent material which can absorb emission from the light emitting elements 102 and emits light of different wavelength. Examples of such a wavelength converting member include an oxide-based fluorescent material, a sulfide-based fluorescent material, and a nitride-based fluorescent material. In the case where a gallium nitride based light emitting element to emit blue light is used as the light emitting element 102, fluorescent materials to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. More specifically, in the case where the light emitting device body 100 is used for the display devices such as backlights of liquid crystal displays and TV-screens, a SiAlON-based fluorescent material and a SCASN-based fluorescent material are preferably used in combination. Also, in the case where the light emitting device body 100 is used for lighting applications, a YAG-based fluorescent material or a LAG-based fluorescent material and a SCASN-based fluorescent material or a CASN-based fluorescent material are preferably used in combination.

The connector 104 is arranged on the first end portion 101a of the base member 101. The connector 104 is electrically connected to the plurality of the light emitting elements 102 via the base member 101. The connector 104 can receive power from an external power source, and supply the power from the external power source to a plurality of light emitting elements 102.

2. Structure of Base Member 101

Figure 5:
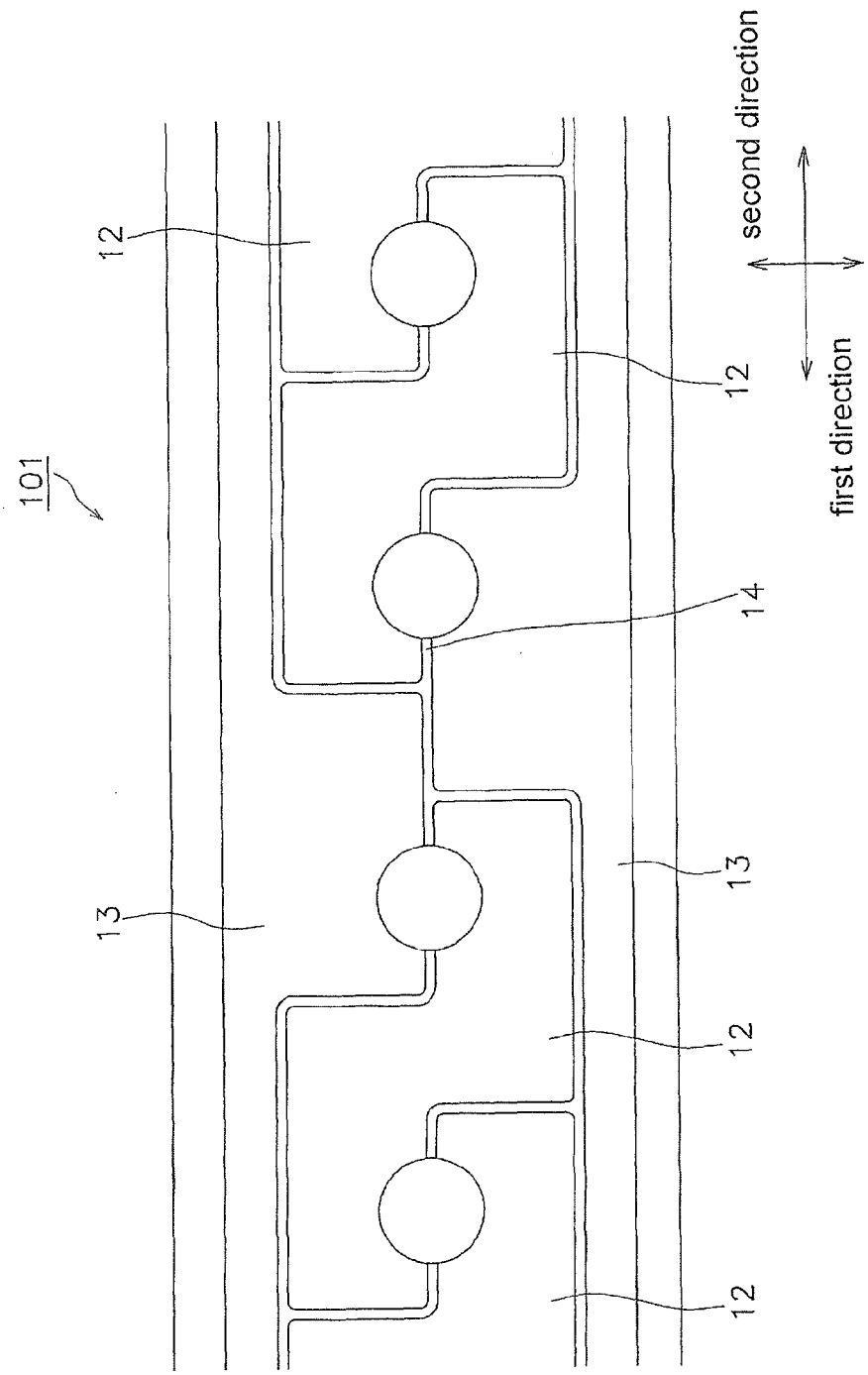
FIG. 5 is a partially enlarged view of FIG. 3.
Figure 6:
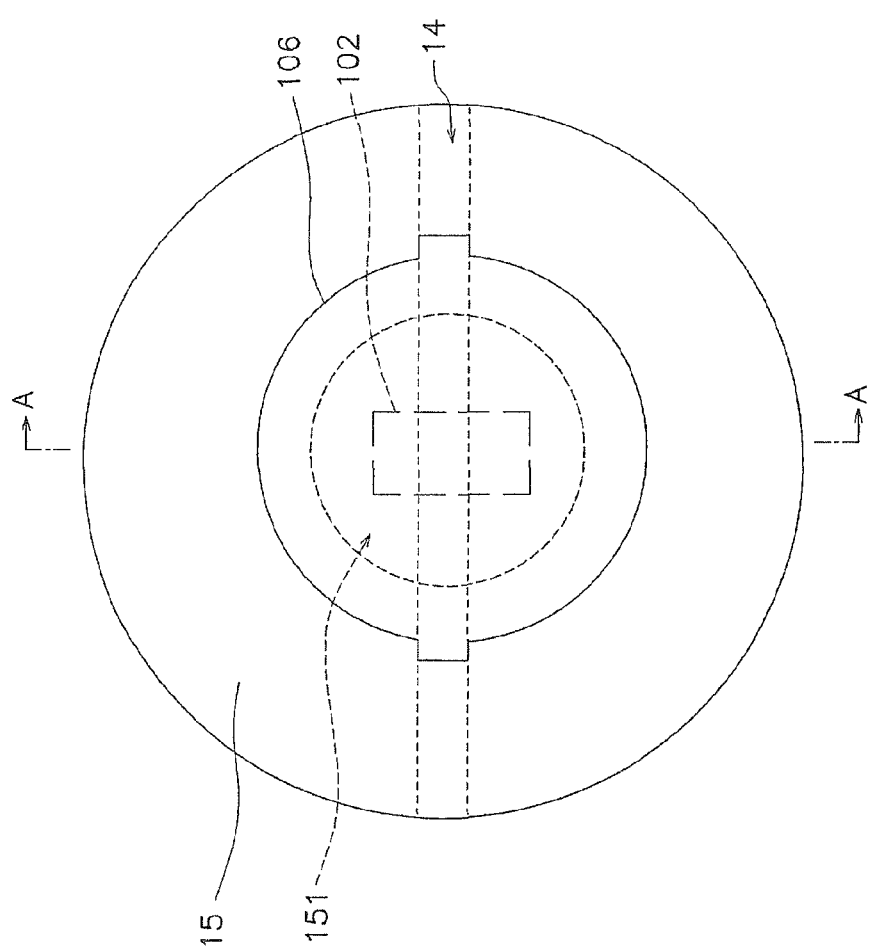
FIG. 6 is a partially enlarged view of FIG. 5.

Next, the structure of the base member 101 will be described with reference to the drawings. FIG. 5 shows a partially enlarged view of FIG. 3. FIG. 6 shows a partially enlarged view of FIG. 5. In FIG. 6, the sealing resin member 103 is omitted to illustrate the inner structure.

The base member 101 includes a substrate 11, a plurality of wiring portions 12, a pair of terminal portions 13, a groove portion 14, and a reflective layer 15.

The substrate 11 can be made of a flexible insulating material. For such a material, an insulating resin such as polyethylene terephthalate and polyimide can be preferably used but is not limited thereto. For example, the substrate 11 may be made of a strip of copper foil or aluminum foil which is covered with an insulating resin. The substrate 11 may have a thickness of about 10 μm to about 100 μm. The material of the substrate 11 can be appropriately selected in view of the type of mounting of the light emitting elements 102, the reflectance, and adhesion with other members, etc. For example, in the case where a solder is used for mounting the light emitting elements 102, a polyimide which has a high heat resisting property is preferably used, and in the case where the reflective layer is not disposed on the substrate 11, a material which has a high optical reflectance (for example a white color material) is preferably used.

The plurality of wiring portions 12 are arranged on a main surface of the substrate 11. The plurality of wiring portions 12 are made of a thin metal film such as a copper foil or an aluminum foil, for example. As shown in FIG. 5, the plurality of wiring portions 12 are arranged in a zigzag manner along the first direction. The plurality of wiring portions 12 are also arranged spaced apart from one another in the first direction. The plurality of wiring portions 12 are also arranged spaced apart from the pair of terminal portions 13 in the first direction.

The plurality of wiring portions 12 are covered with the reflective layer 15. But as described below, a part of the plurality of wiring portions 12 are exposed from the reflective layer 15 in the openings 151 formed in the reflective layer 15. Each of the plurality of wiring portions 12 are connected to the light emitting elements respectively in the region exposed from the reflective layer 15 in each opening 151.

Each of the plurality of wiring portions 12 has a thickness which does not impair the flexibility of the substrate 11 and a thickness of 8 μm to 150 μm is preferable. The plurality of wiring portions 12 are preferably disposed with a wide area to improve heat dissipation. Also, the surface areas (or volume) of a pair of wiring portions 12 to which one light emitting element to be connected are preferably equal so that heat applied on each wiring portions 12 can be uniform throughout the device at the time of heating in a reflow step or the like when mounting the light emitting elements.

The pair of terminal portions 13 is arranged on a main surface of the substrate 11. The pair of terminal portions 13 extends in the first direction at the both sides of the plurality of wiring portions 12 and connected to the connector 104.

The groove portion 14 is portion on the main surface of the substrate 11 where the plurality of wiring portions 12 and the pair of terminal portions 13 are not arranged. That is, the groove portion 14 is formed between the plurality of wiring portions 12 and between the wiring portions 12 and their corresponding terminal portions 13. The interval between the groove portions 14 can be, for example, may be about 0.05 mm to about 5 mm.

The reflective layer 15 covers the plurality of wiring portions 12 and the pair of terminal portions 13. The reflective layer 15 also covers the groove portion 14. The reflective layer 15 is made of a material which can reflect light emitted from the light emitting elements 102. For such a material, an insulating white ink whish is a so-called white resist made of a silicone resin containing titanium oxide can be preferably used. The reflective layer 15 includes a plurality of openings 151, one of which is shown in FIG. 6. The opening portions 151 are arranged so that the light emitting elements 102 are connected to the pair of wiring portions 12, or the light emitting elements 102 are connected to a wiring portion 12 and a terminal portion 13, respectively. The opening portions 151 are, one of which is shown in FIG. 6, covered with an underfill material 106 which will be described below.

3. Structure of Light Emitting Elements 102

Figure 7:
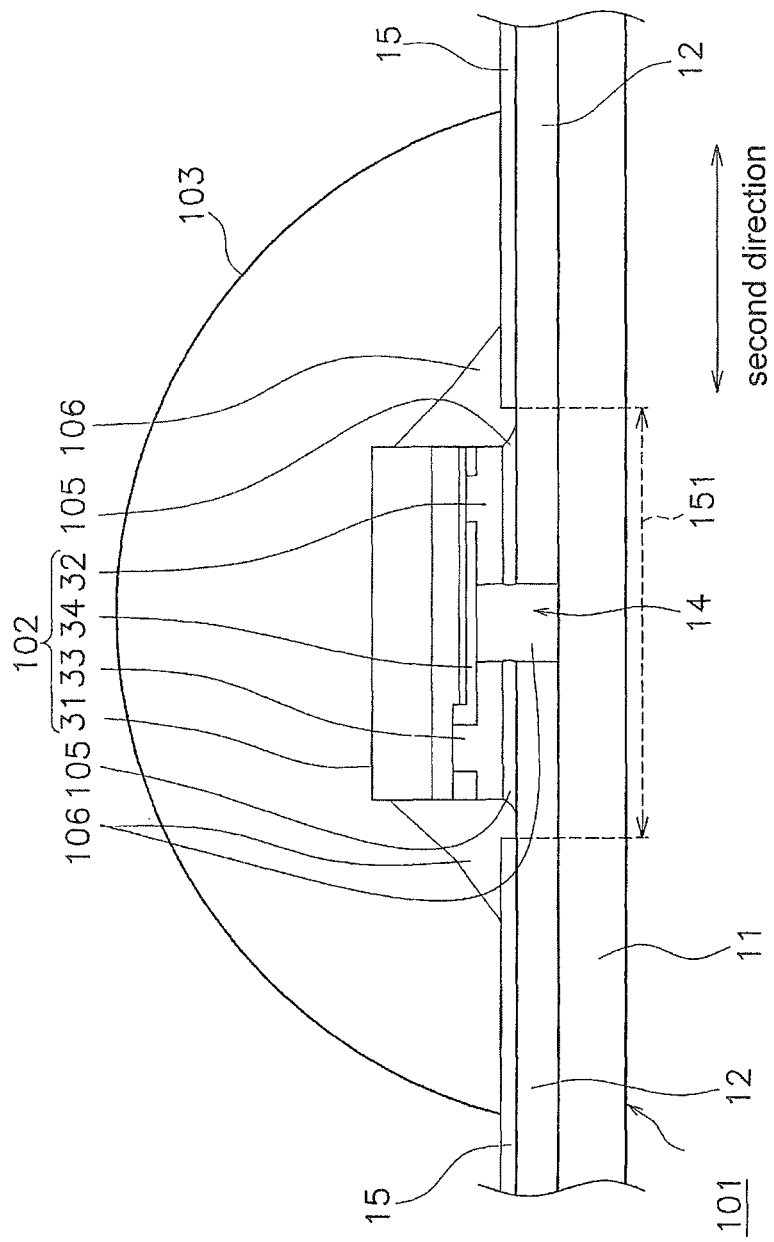
FIG. 7 is a cross sectional view taken along line A-A of FIG. 6.

Next, the structure of each of the light emitting elements 102 will be described with reference to the drawings. FIG. 7 is a cross sectional view taken along line A-A of FIG. 6.

The light emitting element 102 is mounted in a flip chip manner in the opening 151 of the reflective layer 15. The light emitting element 102 is connected to a pair of wiring portions 12 via a pair of bonding members 105 respectively. The bonding member 105 can be made of, for example, a solder such as Sn—Ag—Cu system, Au—Sn system, or a Sn—Cu system, a metal such as Au, an anisotropic conductive paste, or a Ag paste. An underfill material 36 is filled between the light emitting element 102 and the base member 101. The underfill material 106 can be made of, for example, a silicone resin or an epoxy resin, a fluororesin, or a hybrid resin containing one or more those resins. The underfill material 106 preferably has a light reflecting property by containing titanium oxide, silicon oxide, or alumina, which has a white color.

Each of the light emitting elements 102 can include, as shown in FIG. 7, a semiconductor structure 31, a p-side electrode 32, an n-side electrode 33, and an insulating material layer 24. The semiconductor structure 31 includes an n-type layer, an active layer, and a p-type layer which are stacked in the order on a light-transmissive sapphire substrate. The n-type layer, the active layer and the p-type layers can be respectively made of, for example, a gallium nitride-based semiconductor. The p-side electrode 32 and the n-side electrode 33 are respectively connected to a pair of wiring portions 12 via a pair of bonding members 105. The n-side electrode 33 is extended to a lower portion of the p-type layer via the insulating material layer 34.

Performance and Effect

At the time of packaging the light emitting device of Patent Literature 1: JP2011-228602A by re-reeling, due to the friction between the flexible substrate and the sealing resin member, the surface of the sealing resin member may be damaged. Also, in the case where the light emitting device is attached to an object (such as a heat sink) for use, due to the light emitting device being pressed against the object, the sealing resin member may be crushed.

The present disclosure is directed in view of the above circumstances, and an object is to provide a light emitting device equipped with a protective member which can prevent damage on the sealing resin member.

(1) The light emitting device 1 equipped with a protective member includes a light emitting device body 100 and a protective member 200. The light emitting device body 100 includes a flexible base member 101, at least one light emitting element 102 arranged on the base member 101, and a sealing resin member 10 sealing the light emitting element 102. The protective member 200 is disposed adjacent to the sealing resin member 103 on the base member 101. The height L1 of the protective member 200 is greater than the height L2 of the sealing resin 103.

Accordingly, the protective member 200 can prevent the sealing resin member 103 from being damaged. More specifically, at the time of packaging and shipping the light emitting device 1 equipped with a protective member, the sealing member 103 can be prevented from dubbing with other members. Also, in the case where the light emitting device body 100 is used attached to a heat sink or the like, the protective member 200 can be pushed against the heat sink, so that the sealing resin members 103 can be prevented from receiving an excessive pressure.

(2) The protective member 200 is removably attached with respect to the base member 101.

Accordingly, after attaching the light emitting device body 100 to a heat sink or the like, the protective member can be removed from the light emitting device body 100.

(3) The protective member 200 is disposed adjacent to the electronic component 104 on the base member 101.

Accordingly, the protective member 200 can prevent the electronic component 104 from being damaged.

OTHER EMBODIMENTS

The present invention is described with reference to the embodiment illustrated in the accompanying drawings. It should be understood, however, that the description and the drawings are intended as illustrative of the present invention, and the scope of the present invention is not limited to those described above. Various alternate embodiments, examples, and operational technologies will become apparent to one skilled in the art, from the description provided herein.

(A) In the embodiment above, the light emitting device 1 equipped with a protective member is an elongated member having a first direction of its longitudinal direction, but is not limited thereto. The light emitting device 1 equipped with a protective member may be a square member.

(B) In the above embodiment, the light emitting device body 100 includes a connector 104 as an example of its electric components, but is not limited thereto. The light emitting device body 100 may include, for example, various diodes, as its electronic components.

(C) In the above embodiment, the light emitting elements 102 are mounted in a flip-chip manner, but are not limited thereto. The light emitting elements 102 may be mounted using die-bonding or wire bonding technique.

(D) In the above embodiment, the protective member 200 surrounds all of the plurality of sealing resin members 103 and the connector 104, but is not limited thereto. The protective member 200 may surround only a part of the plurality of sealing resin members 103, or may not surround the connector 104.

(E) In the above embodiment, the sealing resin members 103 are exposed in the housing holes 202 of the protective member 200 respectively, but are not limited thereto. The protective member 200 may cover a pat of or all of the sealing resin members 103. With this arrangement, the sealing resin members 103 can be further prevented from being damaged.

Figure 8:
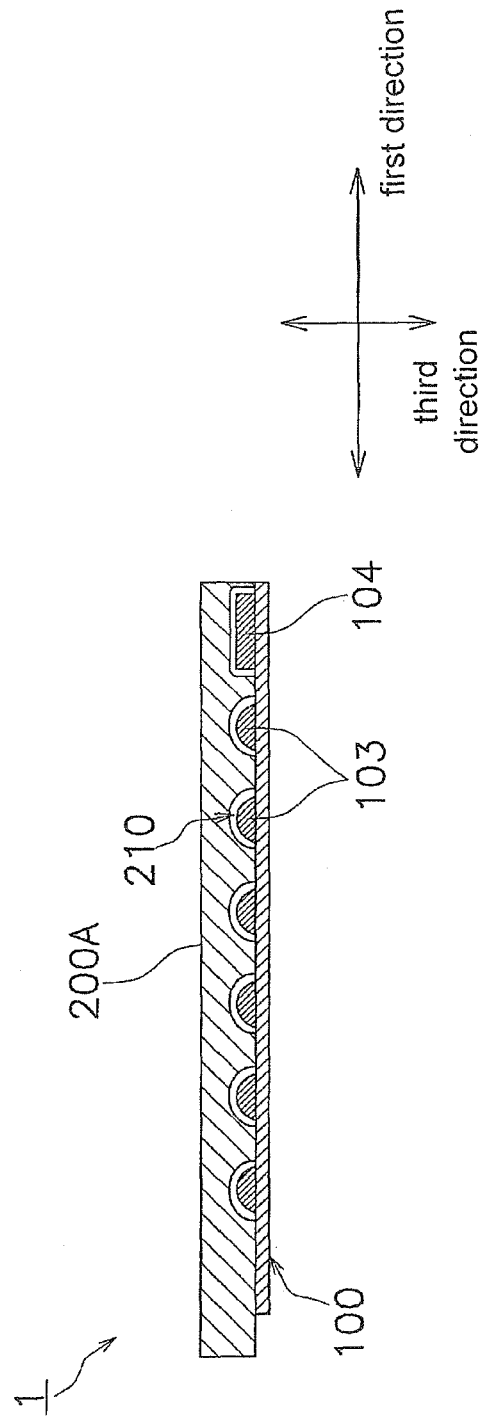
FIG. 8 is a cross-sectional view showing a structure of a light emitting device equipped with a protective member.

More specifically, as shown in FIG. 8, the protective member 200A is sufficient to have recesses 210 instead of the housing holes 202. In this case, in each recess 210, a gap is preferably formed between the inner surface of the protective member 200A and the surface of the sealing resin member 103.

Figure 9:
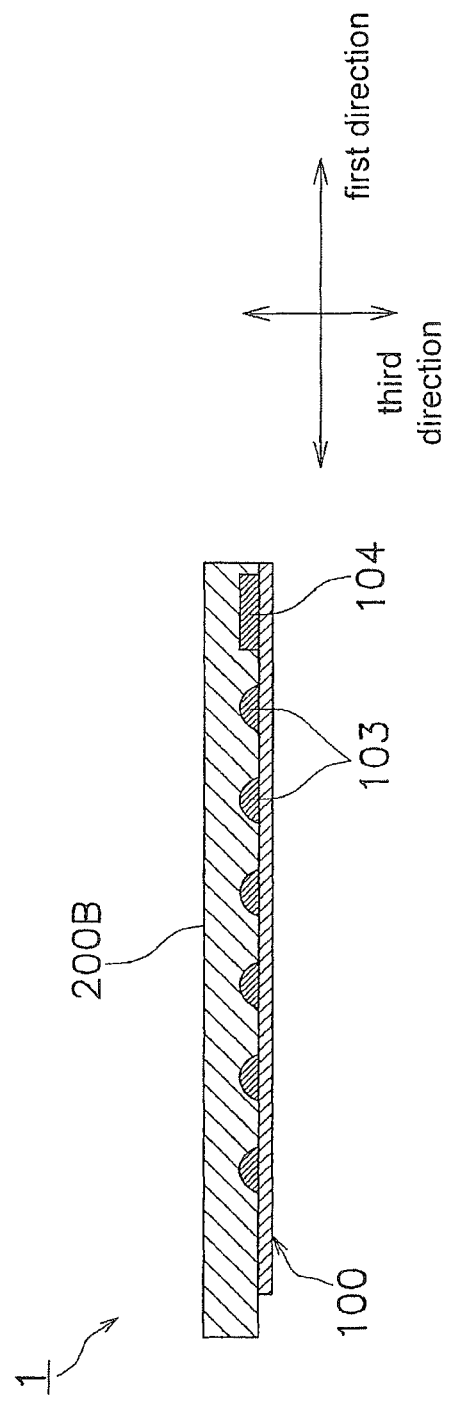
FIG. 9 is a cross-sectional view showing a structure of a light emitting device equipped with a protective member.

On the other hand, in the case where the protective member is made of a flexible material, the holes or the recesses to avoid contact with the sealing resin member 103 are not needed to be formed. In this case, as shown in FIG. 9, the protective member 200B deforms so as to enclose the sealing resin member 103. Thus, stress can be avoided from being applied to the sealing resin member 103, and also can be prevented from being imposed as a resistance at the time of rolling up the light emitting device 1 equipped with a protective member. The above is not limited to the sealing resin member 103, and a part or all of the connector 104 may be covered with the protective member 200.

Figure 10:
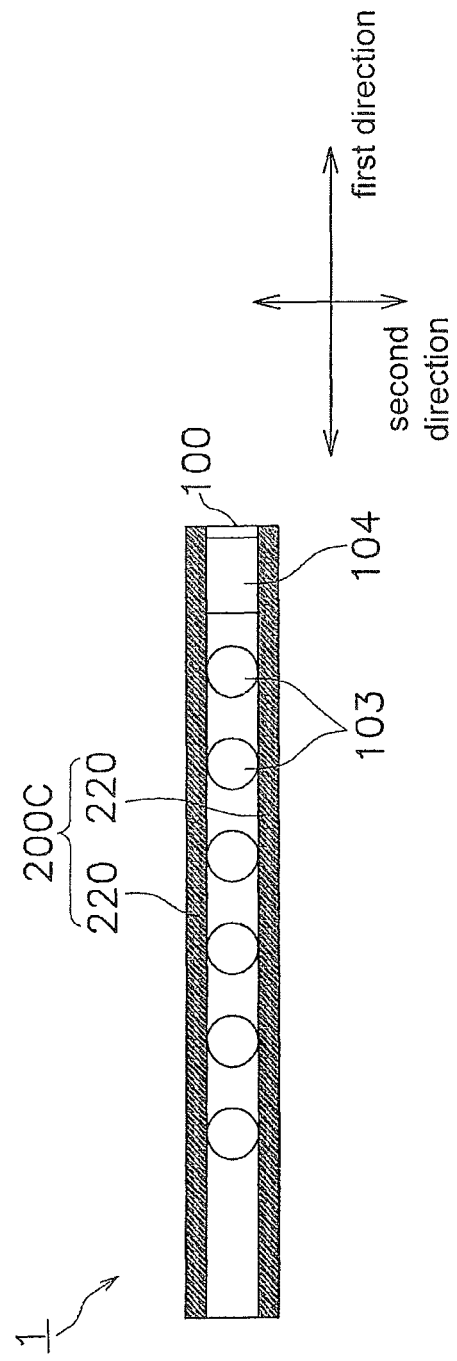
FIG. 10 is a top view showing a structure of a light emitting device equipped with a protective member.

(F) In the above embodiment, the sealing resin members 103 are arranged respectively in the housing holes 202 of the protective member 200 and are surrounded by the protective member 200, but are not limited thereto. The protective member is sufficient to be arranged adjacent to its corresponding sealing resin member 103 on the base member 101. For example, as shown in FIG. 10, the protective member 200C may be made with two rod-shaped members 220. The two rod-shaped members 220 can be arranged along the first direction at each side of the plurality of sealing resin members. Also with such a protective member 200C, the sealing resin members 103 can be prevented from rubbing with other members.

As described above, it should be obvious that various other embodiments are possible without departing the spirit and scope of the present invention. Accordingly, the scope and spirit of the present invention should be limited only by the following claims. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device assembly comprising:
 a light emitting device having
  a flexible base member including a flexible substrate, and flexible wiring portions and flexible terminal portions disposed over the flexible substrate, each of the flexible wiring portions and the flexible terminal portions being sheet-shaped,
  at least one light emitting element arranged on the base member, and
  a sealing resin member sealing the light emitting element; and
 a protective member disposed adjacent to the sealing resin member on the base member, the protective member having a height greater than a height of the sealing resin member, the protective member being removably attached with respect to the base member.

2. The light emitting device according to claim 1, wherein the protective member covers the sealing resin member.

3. The light emitting device according to claim 1, wherein the light emitting device includes an electronic component arranged on the base member and electrically connected to the at least one light emitting element, and
the protective member surrounds an outer periphery of the electronic component.

4. The light emitting device according to claim 3, wherein the protective member covers the electronic component.

5. The light emitting device according to claim 1, wherein the light emitting device is an elongated member extending in a prescribed direction, and
the light emitting device includes a plurality of light emitting elements including the at least one light emitting element, the light emitting elements being aligned along the prescribed direction.

6. The light emitting device according to claim 1, wherein the protective member includes a plurality of dividers and a plurality of housing holes.

7. The light emitting device according to claim 1, wherein the protective member is formed with an insulating resin.

8. The light emitting device according to claim 1, wherein the protective member is formed with a porous material with elasticity or flexibility.

9. The light emitting device according to claim 1, wherein the protective member is larger than the light emitting device.

10. The light emitting device according to claim 1, wherein an A-hardness of the sealing resin member is 30 or greater, and a D-hardness of the sealing resin member is 50 or less.

11. The light emitting device according to claim 1, wherein the sealing resin member contains a light diffusing agent.

12. The light emitting device according to claim 1, wherein the flexible substrate has a thickness of about 10 μm to about 100 μm.

13. The light emitting device according to claim 1, wherein the at least one light emitting element is mounted in a flip chip manner on the base member.

14. The light emitting device according to claim 1, wherein the light emitting device includes an underfill material filled between the at least one light emitting element and the base member.

15. The light emitting device according to claim 1, wherein a gap is formed between an inner surface of the protective member and a surface of the sealing resin member.

* * * * *